United States Patent [19]

Bonneau et al.

[11] Patent Number: 4,988,893

[45] Date of Patent: Jan. 29, 1991

[54] LATCH CELL FAMILY IN CMOS TECHNOLOGY GATE ARRAY

[75] Inventors: Martine Bonneau, Itteville; Gerard Boudon, Mennecy; Jean-Claude Le Garrec, Longjumeau; Pierre Mollier, Boissise Le Roi; Frank Wallart, Vert-Saint-Denis, all of France

[73] Assignee: International Business Machines Corporation, Armonk, N.Y.

[21] Appl. No.: 75,806

[22] Filed: Jul. 20, 1987

[30] Foreign Application Priority Data

Dec. 30, 1986 [EP] European Pat. Off. ........ 86430057.9

[51] Int. Cl.$^5$ ..................... H03K 3/26; H03K 19/094; H03K 3/29
[52] U.S. Cl. .................... 307/279; 307/451; 307/572; 307/585; 307/291; 377/61
[58] Field of Search ............... 307/443, 448, 451, 279, 307/585, 572, 291; 377/61, 117

[56] References Cited

U.S. PATENT DOCUMENTS

| | | | |
|---|---|---|---|
| 4,554,664 | 11/1985 | Schultz | 371/25 |
| 4,558,237 | 12/1985 | Rabe et al. | 307/475 |
| 4,728,823 | 3/1988 | Kinoshita | 307/279 |
| 4,794,283 | 12/1988 | Allen et al. | 307/291 |

FOREIGN PATENT DOCUMENTS 0150314 12/1985 Japan.
113319 10/1986 Japan.

OTHER PUBLICATIONS

IEEE Transactions of Nuclear Science, vol. NS-30, No. 6, 12/83 "Considerations for Single-Event Immune VLSI Logic".
IBM TDB vol. 27, No. 7A, Dec. 1984 "Fast Shift Register Latch in CMOS Technology".
Patent Abstracts of Japan, vol. 9, No. 318 (E-366) [2041], Dec. 13, 1985; & JP-A-60 150 324 (Mitsubishi Denki K.K.) 08-08-1985.
Patent Abstracts of Japan, vol. 10, No. 297 (E-444) [2353], Oct. 9, 1986; & JP-A-61 113 319 (Mitsubishi Electic Corp.) 31-05-1986.
IEEE Transactions on Nuclear Science, vol. NS-30, No. 6, Dec. 1983, pp. 4501–4507, IEEE, New York, U.S.; S. E. Diehl et al.: "Considerations for Single Event Immune VLSI Logic" p. 4504, FIG. 3.

Primary Examiner—Stanley D. Miller
Assistant Examiner—Margaret Rose Wambach
Attorney, Agent, or Firm—W. T. Ellis; Otho B. Ross, III

[57] ABSTRACT

The invention provides novel implementations of a latch cell in CMOS gate array technology to produce latch dissymmetry and permit a single ended data input. The dissymmetry is produced by increasing the output impedance of the second stage of the latch cell, which can be done, either in a DC or in an AC mode, or even in a mixed version of both modes.

1 Claim, 6 Drawing Sheets

PRIOR ART

LATCH CELL FAMILY IN CMOS TECHNOLOGY GATE ARRAY

TECHNICAL FIELD

The invention relates to logical integrated circuits and more particularly to a high density, high performance, dissymmetrical latch cell with a single ended data input, well adapted to the CMOS gate array technology.

BACKGROUND OF THE INVENTION

Latches represent a large portion of the silicon area in logic semiconductor chips. This is especially true for CMOS gate arrays where latches require either devices of different sizes or a large number of identical devices: statistics indicate that 20 to 50 percent of the silicon area in CMOS gate arrays is used by latches, the average value being around 40 percent.

Figure 1A:
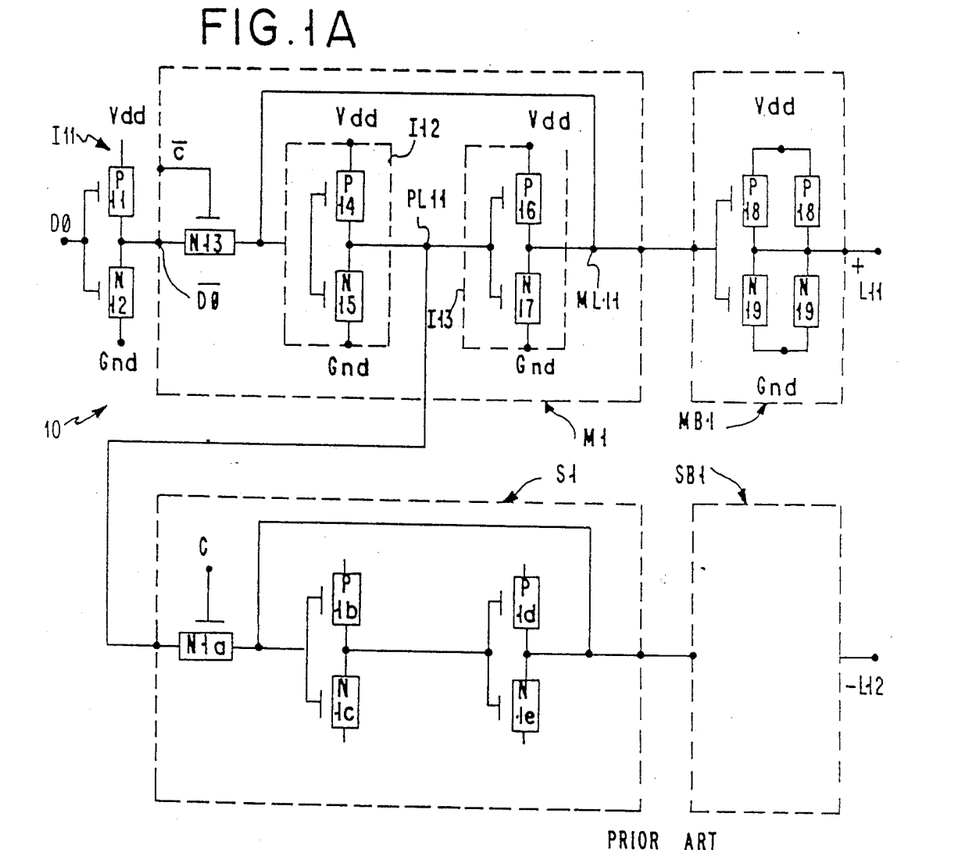
FIG. 1A is an electrical schematic block diagram of a prior art Polarity Hold Shift Register Latch (PHSRL) including master and slave sections implemented according to the master image technology.
Figure 1B:
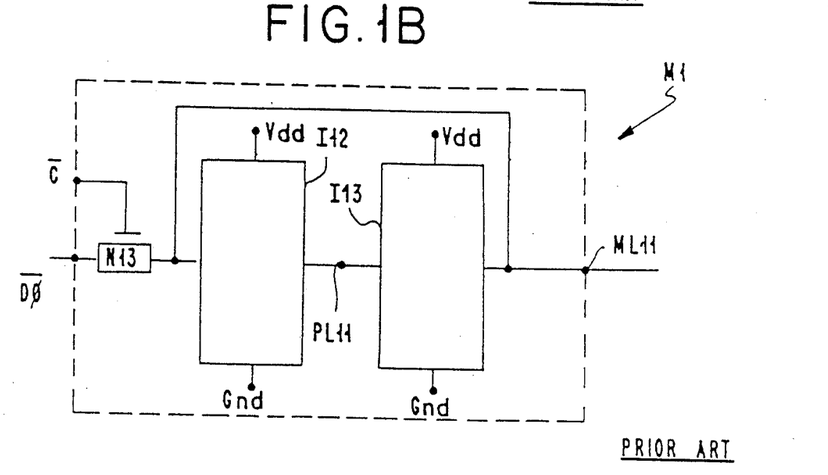
FIG. 1B is an electrical schematic block diagram of the master section of the circuit of FIG. 1A.

The Polarity Hold SRL (PHSRL) is one of the most frequently used, and therefore it has been chosen to illustrate the present application. FIG. 1A of the present application shows a known implementation in a Master Image environment when two outputs and one single ended data input are used. The PHSRL 10 of the D type master-slave flip-flop, is composed of two sections, known in the art as a "master" section and a "slave" section, referenced M1 and S1; respectively. For example, M1 is conventionally driven by a standard inverter I11 for the data input DO and a by pass transistor (transmission gate) T13 for the $\overline{C}$ clock. Two output buffers MB1 and SB1 are also provided for data outputs L11 and L12. FIG. 1B schematically details the functional structure of the master section M1 of PHSRL 10 of FIG. 1A. Each of the sections may also be viewed as an inverting latch cell. One general type of prior art inverting latch cell, (e.g. M1) typical of CMOS digital logic implementation, comprises a CMOS transmission gate T13 at the cell input supplying a pair of cross-coupled CMOS inverters I12 and I13. In the cross-coupled configuration, the output of one inverter is directly connected to the input of the other inverter, and the output of the other inverter is directly connected to the input of the one inverter. FIG. 1B shows clearly the two stage structure resulting from cross coupling the two inverters I12 and I13. Each stage is provided with a pair of voltage supply nodes, each connected to first and second supply voltages (Vdd and Ground). A standard CMOS inverter such as I12 includes a complementary pair of IGFETs T14 and T15. Thus, each inverting latch cell or section includes five IGFETs, for a total of ten IGFETs in the overall D-type master-slave flip-flop.

To form a D-type flip-flop master-slave, as represented in FIG. 1A, the two inverting latch cells are connected in series, with the clock inputs $\overline{C}$ and C connected to the two transmission gates T13 and T1a respectively so that the transmission gates are alternately enabled. Typically, the transmission gate T13 of the first or "master" section is enabled when the clock input $\overline{C}$ is high, and the transmission gate of the second or "slave" section is enabled when the clock input C is high.

In general operation, with the clock $\overline{C}$ input high, input data DO is passed via the master section transmission gate T13 into the master section latch M1 comprising a pair of cross coupled inverters I12 and I13. When the clock input $\overline{C}$ goes low, the transmission gate T13 of the master section M1 is no longer enabled, isolating the data input DO from the flip-flop. At the same time, the slave section transmission T11a gate is enabled, coupling inverted data from the master section into the latch of the slave section, where the data appear at the output —L12. When the clock C goes low, the transmission gate T1a of the slave section is no longer enabled, isolating the slave section from the rest of the flip-flop, and the slave section accordingly retains the output logic voltage level until a subsequent low to high clock transition.

In any case, the integrated circuit typically includes a number of other elements supporting the flip-flop circuit. These other elements include, at least, voltage supply lines or nodes connected to a positive voltage VDD and the ground GND. Also, typical D-type master-slave flip-flops require complementary clock inputs (e.g. C and $\overline{C}$) and an inverter will typically be included, common to a number of individual D-type master-slave flip-flops to provide said complementary clock inputs. Latch M1 has a data input (DO input), either one or a pair of complementary data outputs PL11 and ML11, and a clock input. In operation, a logic state is retained or latched at the output or outputs indefinitely as long as the clock level remains low (binary "0"). Data, in the form of a logic level, is transferred to the data output (PL11 output) upon a specified clock pulse edge or transition of the clock input from logic low to logic high. If provided, complementary data is available at the ML11 output. Dissymmetry between the inverters is necessary, otherwise the latch cell will never switch when a single ended data input is used.

This PHSRL 10 uses a minimum number of devices but requires different sizes of devices (transistors) to assure that this dissymmetry is obtained. For example device T14 (or T15) in series with T1a must have a lower impedance than T1e (or T1d), in order to avoid disturbing the state of the master when transferring the data into the slave when transistor T1a is switched on by clock C. T11 (or T12) in series with T13 must also have a lower impedance than T17 (or T16) to insure that the input DO will force the state into the latch when T13 is switched on by the clock $\overline{C}$.

In other words, during the latch switching with the clock active (high level), two parasitic currents have to be considered to insure a good functionality:

| For DO = 1 T16-T13-T12 | path from VDD to GND thru devices |
| For DO = 0 T11-T13-T17 | path from VDD to GND thru devices |

These parasitic currents may be reduced by decreasing the size of devices T16 and T17 used in inverter I13, by reducing the W/L ratio.

In a Master Image environment, this differentiation is obtained by personalizing the silicon for each circuit to provide devices of different electrical characteristics. In a Masterslice environment such as described here, this is obtained by creating different device sizes in the silicon substrate. This latter technique makes the physical drawing of the cell more sophisticated and generally less efficient for the rest of the logic books because the granularity of the cell becomes larger.

Figure 2A:
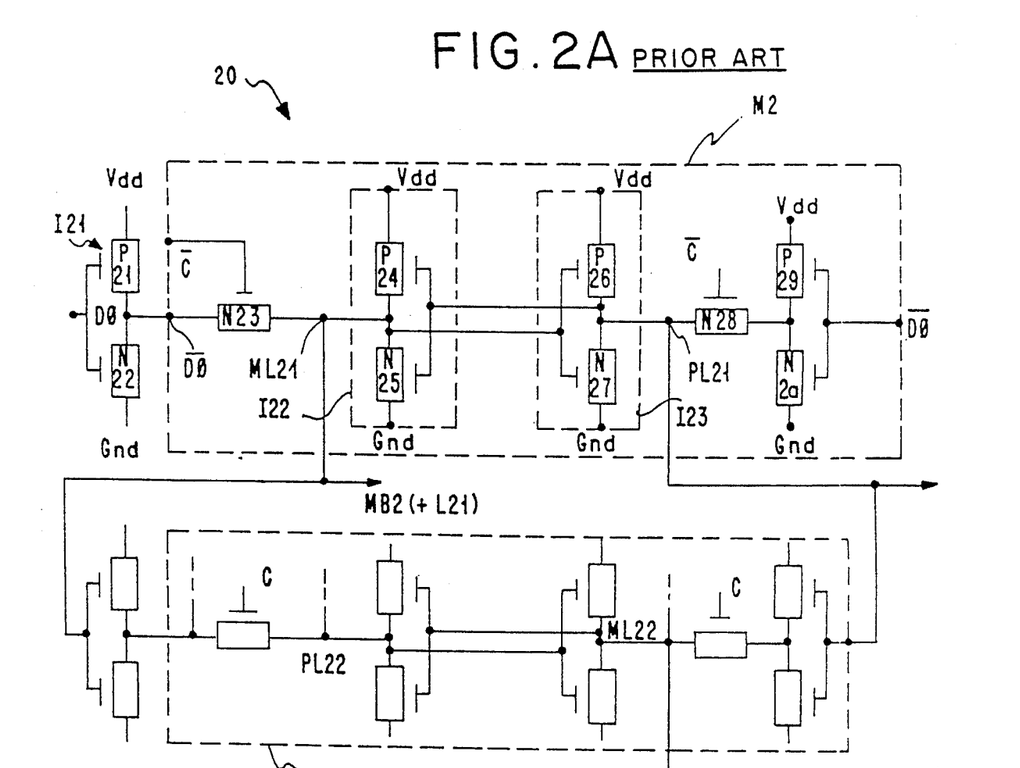
FIG. 2A and FIG. 2B are electrical schematic block diagrams of a prior art PHSRL including master and slave sections implemented according to the gate array technology.

Unlike the master Image approach, the gate array philosophy which appears to be the most promising technology available today is different: only one N and one P device types are used in order to keep the cell granularity small. This has led to high performance symmetrical latches. A fast CMOS PHSRL is shown in the IBM Technical Disclosure Bulletin, vol. 27, No. 7A, December 1984, pp 3894-3896 in an article entitled "Fast shift register latch in CMOS technology" authored by R. Hornung et al. FIG. 2A shows a simplified version of the gate array implementation of this PHSRL, when extra circuits due to LSSD technique (Level Sensitive Scan Design) have been removed. PHSRL 20 performs the same function as the version of FIG. 1A but it has been redesigned for sake of simplicity and comparison. To switch the "master" latch cell M2 from one state to the opposite state needs a symmetrical command by DO and $\overline{DO}$ simultaneously on the two sides of the latch cell through transmission gates T23 and T28. This is made necessary here because in gate arrays, all the devices (transistors) have the same size. This particular implementation of a latch cell uses 8 transistors, compared with the 5 transistor latch cell in the Master Image approach. It is 40% faster and dissipates 1.8 times more power than the version shown in FIG. 1A at same, clock frequency. It has, therefore, very attractive performance. Unfortunately due to its symmetrical implementation, the density is lower compared with the latch shown in FIG. 1 where different device sizes permit a single ended data input with a lower transistor count.

Figure 2B:
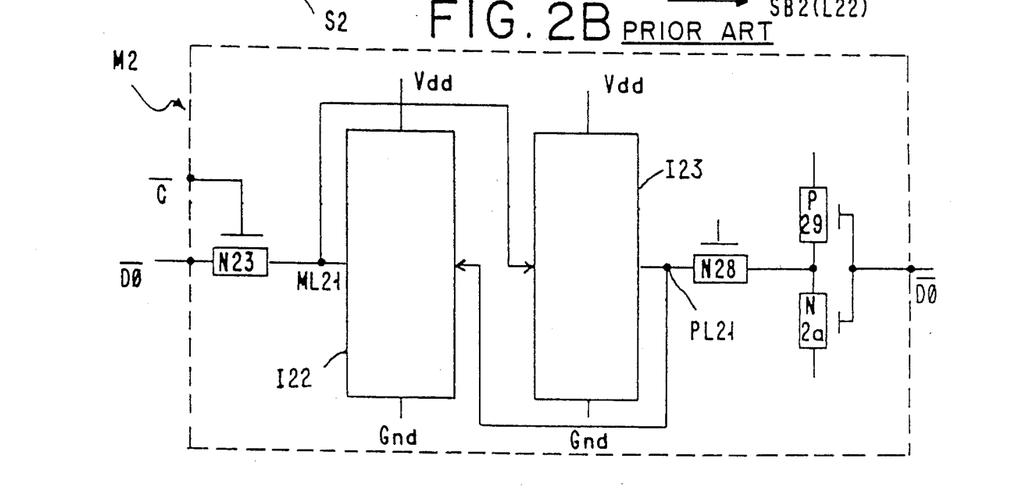

FIG. 2B schematically details the functional structure of the master section M2 of PHSRL 20 of FIG. 2A, and more particularly, points out that with such an implementation the output of one inverter I22 is directly coupled to the input of the other inverter I23, and the output of the other inverter I23 is connected to the input of the one inverter I22 The data $\overline{DO}$ is applied on the input of inverter I23 through transmission gate T23 and its complementary value DO is applied to the input of inverter I22 through a standard transmission T28 gate and an inverter comprised of a pair of complementary IGFETS: T29 and T2a.

It is to be noted that in both versions of FIG. 1A or FIG. 1B, the master and slave sections are identical.

OBJECTS OF THE INVENTION

It is therefore a primary object of the invention to provide a latch cell in CMOS gate array technology to produce latch dissymmetry and permit a single ended data input.

It is another object of the invention to provide a latch cell which may be employed as either section in a D type master-slave flip-flop.

It is another object of the invention to provide various implementations of a latch cell to obtain the desired density/performance compromise.

It is still another object of the invention to provide a latch cell which may be employed in various applications such as Polarity Hold Shift Register Latches, Set/Reset Latches, etc.

SUMMARY OF THE INVENTION

According to the present invention, the dissymmetry is produced by increasing the output impedance of the second stage of the latch cell. The unique advantage of this invention is to give an efficient implementation of this dissymmetry in the constraining environment of gate arrays which use only one N and one P device size. The output impedance increase, in the second stage of the latch, can be introduced either in a DC or in an AC mode, or in a mixed version of both modes. The dissymmetry, in the DC mode, is produced by P or N devices connected in series with the second stage of the latch cell. These devices can be either equivalent to resistor loads when the source to gate voltage is constant, or equivalent to variable loads when the source to gate voltage varies with the pulse transients or states. A wide variety of combinations can be made. The designer can play with these devices at will: adjust the electrical characteristics of the circuit or rearrange the layout and optimize the usage of the transistors in a cell and thus improve the electrical performance, power dissipation and silicon area. This DC dissymmetry is particularly advantageous, from the circuit density point of view, for multiple input latches. The AC mode uses a pull down leg that switches off the output transistor, thus making infinite the impedance to ground, when activated by clock and data input. This AC mode is particularly advantageous from the circuit performance point of view. Applying the DC mode to the one side (e.g. P side) of the stage, to improve density and the AC mode to the other side (e.g. N side), to speed up the slowest transition, allows a good optimization of the compromise between density and performance.

BRIEF DESCRIPTION OF THE DRAWINGS

While the novel features of the invention are set forth with particularity in the appended claims, the invention, both as to organization and content, will be better understood and appreciated, along with other objects and features thereof from the following detailed description taken in conjunction with the drawings; in which:

DESCRIPTION OF THE PREFERRED EMBODIMENTS

According to its more general principle, the present invention proposes novel implementations to produce latch dissymmetry and permit a single ended data input. The dissymmetry is produced by increasing the output impedance of the second stage of the latch. The unique advantage of this invention is to give an efficient implementation of this dissymmetry in the constraining environment of gate arrays which use only one N and one P device size. The output impedance increase, in the second stage of the latch, can be introduced either in a DC or in an AC mode, or in a mixed version of both modes.

Figure 3A:
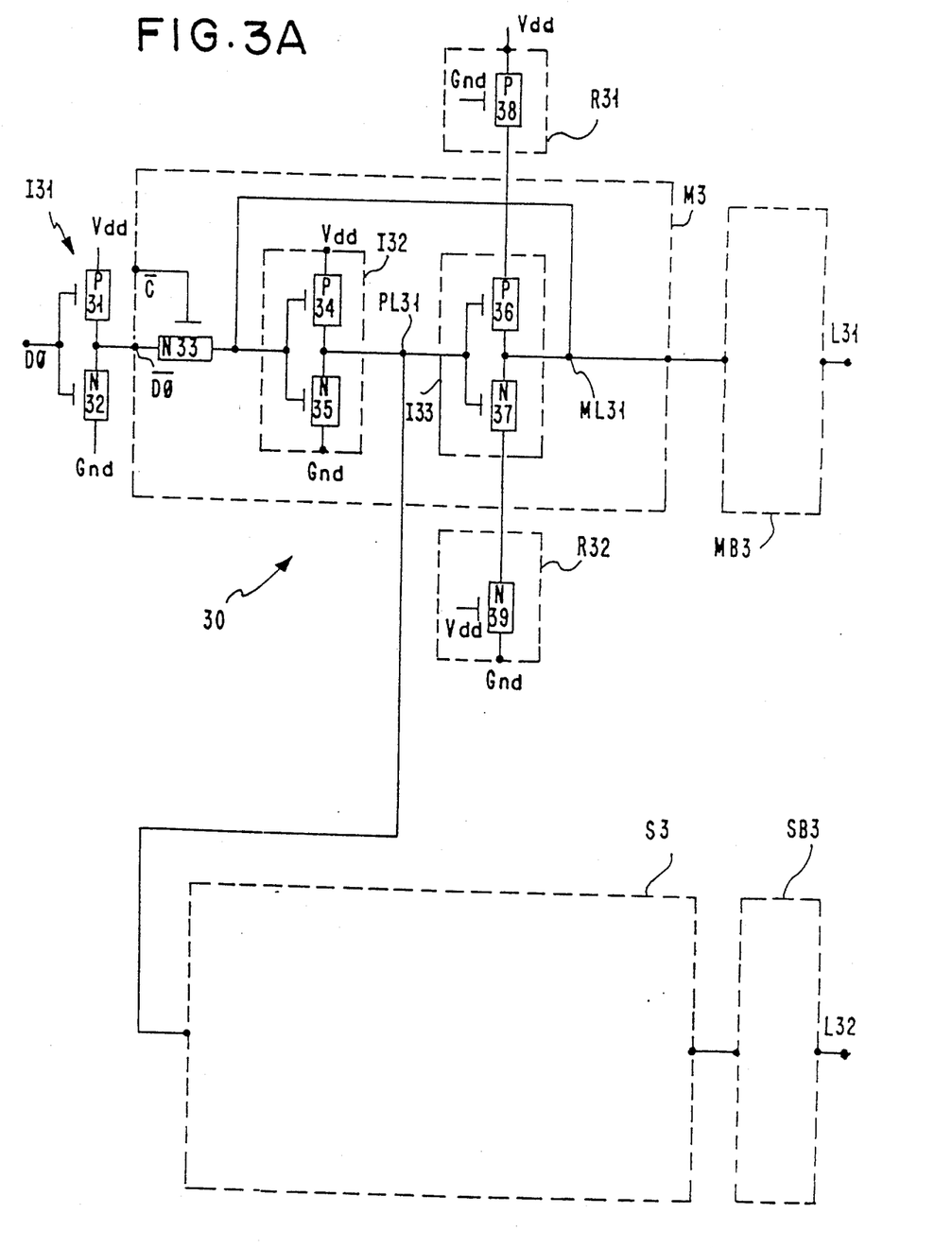
FIG. 3A is an electrical schematic block diagram of a PHSRL including master and slave sections implemented according to the gate array technology, in accordance with a first embodiment of the present invention.

In accordance with a first embodiment, there is disclosed an inverting latch cell 30 shown in FIG. 3A. Basically latch cell 30 has a standard structure, for example it has a data input node, a complementary data output node, and a clock input node for selectively enabling or not enabling the cell. It further includes a pair of voltage supply nodes, and a data storage node.

Figure 3B:
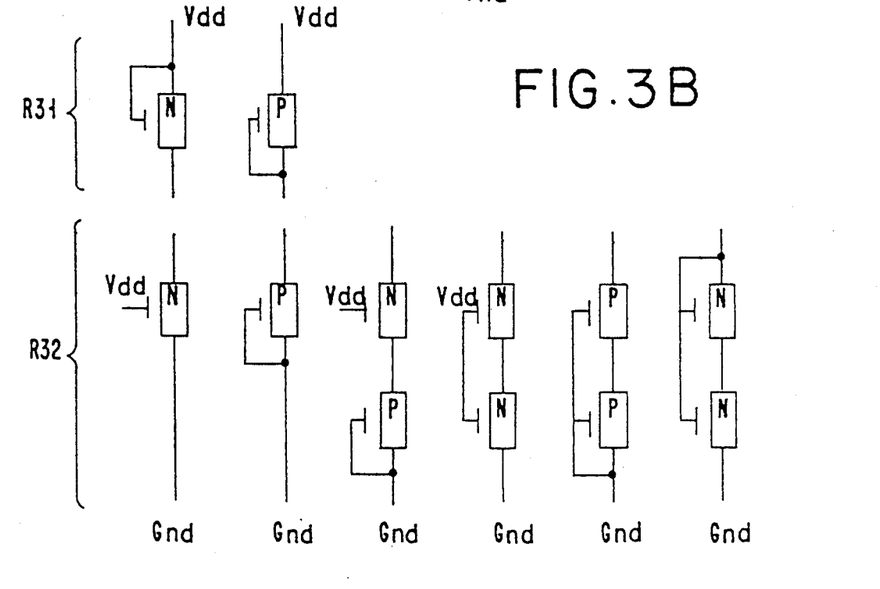
FIG. 3B shows typical combinations of devices to be used as impedances in the embodiment of FIG. 3A.

In a first embodiment shown in FIG. 3A, dissymmetry is produced in the DC mode by impedances connected in series with the second stage of the latch cell. Compared to PHSRL 20 shown in FIG. 2A, the only difference lies in the presence of impedances R31 and R32 in the pathes for the parasitic currents mentioned above between the positive voltage $V_{dd}$ and the ground. Impedance R31 is connected between the positive voltage $V_{dd}$ and the drain of device T36 of inverter I33. It intervenes on the parasitic current when $D\phi=1$ (path from $V_{dd}$ to ground through devices T36, T33 and T32) in order to reduce it. As shown in FIG. 3A, as an example, impedance R31 may be a P type device referenced T38, the gate of which is grounded. Impedance R32 is connected between the ground and the source of device T37 of inverter I33. It intervenes on the parasitic current when $D\phi=0$ (path from $V_{dd}$ to ground through device T31, T33 and T37) in order to reduce it. As shown in FIG. 3A, as an example, impedance R32 may be comprised of an N type device referenced T39, the gate of which is tied to $V_{dd}$. Practically, these impedances can be either equivalent to resistor loads when the source to gate voltage is constant, or equivalent to variable loads when the source to gate voltage varies with the pulse transients or states. A wide variety of combinations, as depicted in FIG. 3B, can be made. The designer can play with these devices at will: adjust the electrical characteristics of the circuit or rearrange the layout and optimize the usage of the transistors in a cell and thus improve the electrical performance, power dissipation and silicon area.

This DC dissymmetry is particularly advantageous from a circuit density point of view for multiple input latches.

The advantages of latch 30 will become apparent from the discussion which follows. (The numbers in parenthesis are those obtained from ASTAP simulations or transistor counts when comparing new PHSRL 30 of FIG. 3A with the conventional PHSRL 20 of FIG. 2). It is to be noted, that the real LSSD versions of PHSRL latches 20 and 30 have been compared hereafter, because of the availability of results.

First, PHSRL 30 exhibits a greater flexibility in electrical and physical layout design. It has a better density (24%), and a better speed, similar or slightly slower at the circuit level itself but better at the chip level because the input loading is divided by 2 on the clocks and by 1.5 on the data. The density improvement also increases the speed since it decreases the average net length. It has a satisfactory symmetry of the up going and down going transitions, smaller power dissipation (divided by 1.8), and smaller current spikes in power supply busses (divided by 1.7).

When using the FET devices in a "diode like" mode (gate and drain shorted together), no sink current is flowing through the device until the threshold voltage VT is reached. Therefore, if some leakage current has to be absorbed, the voltage across the device increases slightly: a current mirror is produced with the first stage of the latch and eventually with the output buffer. The total resulting current is therefore multiplied by 2 if no buffer is connected to the node or by 4 if a buffer is connected.

This effect can be neglected since CMOS leakages are very small (less than picoamperes).

Assuming that the latch area is reduced by 25% and that latches represent 40% of the gate array area per chip, the total silicon area saving is: $0.25 \times 0.40 = 10\%$. The silicon area also slightly increases the final test yield. As an example a final test yield of 50% is improved to 53.5% when the chip area is reduced by 10% (7% yield improvement). As a consequence, the productivity is therefore 17% better.

Still comparing with PHSRL 20, it is to be noted that the average capacitance on a gate array net is 50 percent due to metal wiring and 50% due to gate capacitance. Since reducing the active chip area by 10% reduces the metal length (and capacitance) by 5.4%, it is deducted that the chip area reduction improves the global speed by 2.7%.

In addition, at a given clock frequency, the power dissipation is about proportional to the net capacitances: 5.4% improvement. Moreover the power dissipation of the latch is divided by 1.8. Assuming in a first approximation that the apportionment of power between circuits, within a chip, is proportional to the area occupied by these circuits, this 1.8 factor is applied to 40% of the chip, giving an additional factor of $(0.6+0.4/1.8)=0.822$. The, global improvement becomes $0.946 \times 0.822 = 0.78$. This number may be rounded to 20%.

In conclusion, the LSSD PHSRL latch 30 provides the CMOS logic chips with the following improvements, at chip level:

---
10% in silicon area
7% in manufacturing yield (50% yield raised to 53.5%)
3% in speed
20% in power dissipation
--- or globally: 40% on the cost X performance/power figure of merit.

Figure 4:
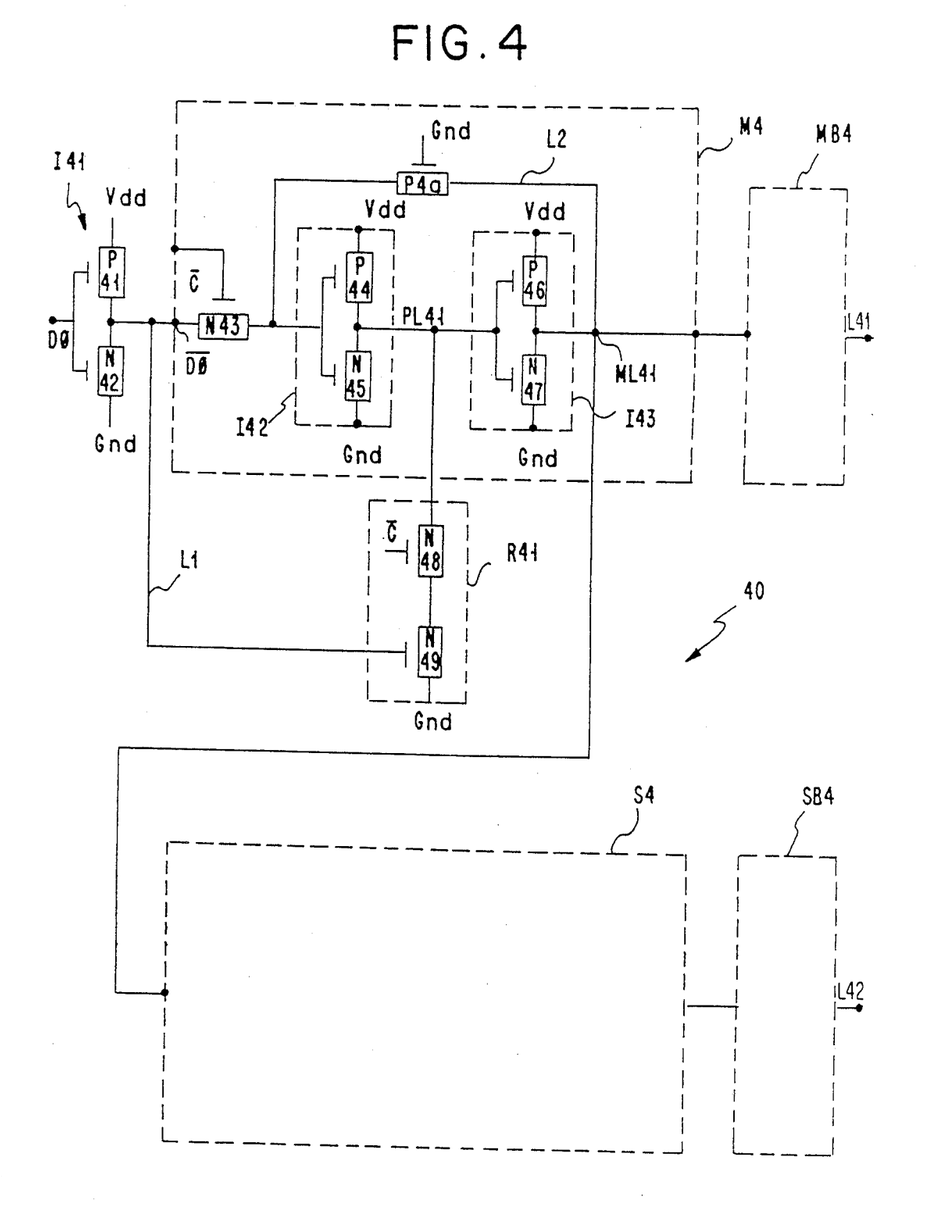
FIG. 4 is an electrical schematic block diagram of a PHSRL including master and slave sections implemented according to the gate array technology, in accordance with a second embodiment of the present invention.

In a second preferred embodiment shown in FIG. 4 the dissymetry is produced in the AC mode by introducing impedance R41 comprised of devices T48 and T49, in a loop L1 between output node PL41 and the input of the latch cell M4. Thus, the AC mode uses a pull down leg comprised of these two devices T48 and T49 that switches off the output device T47, thus making infinite the impedance to ground, when latch cell M4 is activated by clock $\overline{C}$ and data input DO. This pull down leg also permits a single ended data input. An additional device T4a may also be introduced in the loop L2 which connects the output of inverter I43 to the input of inverter I42. It has the great advantage of intervening in both paths of parasitic currents mentioned previously.

When $D\phi=0$ and $\overline{C}=1$, devices T48 and T49 in loop L1 are ON and make the switching easier by acting directly on the input of inverter I43. The current path from $V_{dd}$ to ground thru inverter I43 is very quickly interrupted.

The device T4a (P type transistor always ON the feedback loop L2) is not required for functionality but improves significantly the latch performances. This device can be used as active gate in the LSSD concept (gate driven by the LSSD clock A0).

This implementation improves significantly the propagation delay when the latch is loaded by $D\phi=0$. The poor pull up thru devices T41 and T43 is reinforced by the strong pull down thru devices T48 and T49.

This AC mode is particularly advantageous from the circuit performance point of view.

Figure 5:
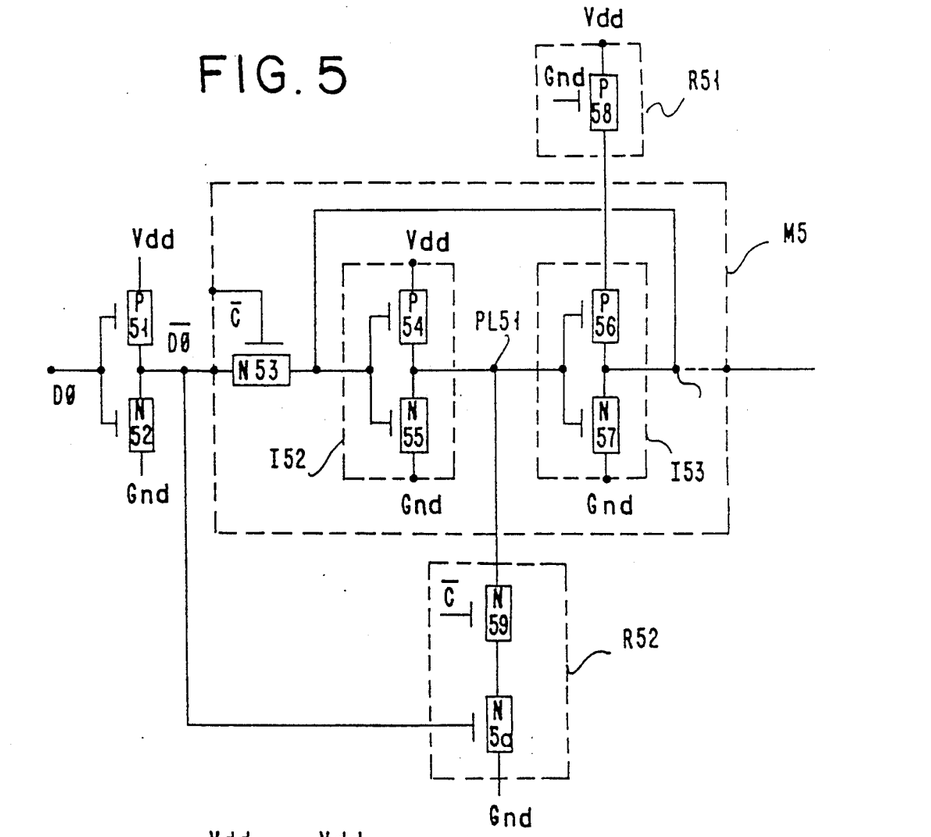
FIG. 5 is an electrical schematic diagram of the basic cell latch according to a third embodiment of the present invention.

According to the third preferred embodiment, the output impedance increase, in the second stage of the latch cell, is introduced by a combination of both AC and DC modes. FIG. 5 shows an example of such a compromise. According to that figure, the DC mode is applied to the P side of the stage (impedance R51) to improve density and the AC mode is applied to the N side (impedance R52) to speed up the slowest transition. The combination of impedances R51 and R52, allows a good optimization of the compromise between density and performance.

Impedance R51 comprised of device T58 is connected in series between the voltage supply $V_{dd}$ and the drain region of device T56 of inverter I53. Combinations detailed for impedance R31 still apply here. Impedance R52, comprised of devices T59 and T5a is introduced in parallel between output PL51 and the input of latch cell M5.

This novel concept has a very wide field of applications because the invention is directly related to the basic latch cell structure such as reference M3 in FIG. 3A, M4 in FIG. 4 and M5 in FIG. 5 which may be adapted in that respect.

The Polarity Hold SRL has been treated in detail here but other latches can take advantage of this invention, such as Register Strings or Arrays
Set/Reset Latches

RESULTS

Simulations have been performed to provide propagation delays from clock signals to master and slave outputs for the four LSSD versions of the four PHSRL referred to as 20, 30, 40 and 50 in the present application.

| Assumptions: Technology CMOS |
| --- |
| $V_{dd}$ 5V ± 10% |
| T = 70 degrees C. |

| -continued |
| --- |
| Assumptions: Technology CMOS |
| Clock rise/fall time = 2 nS (10 to 90%) |
| Delay measurement point: 50% |

Figure 6:
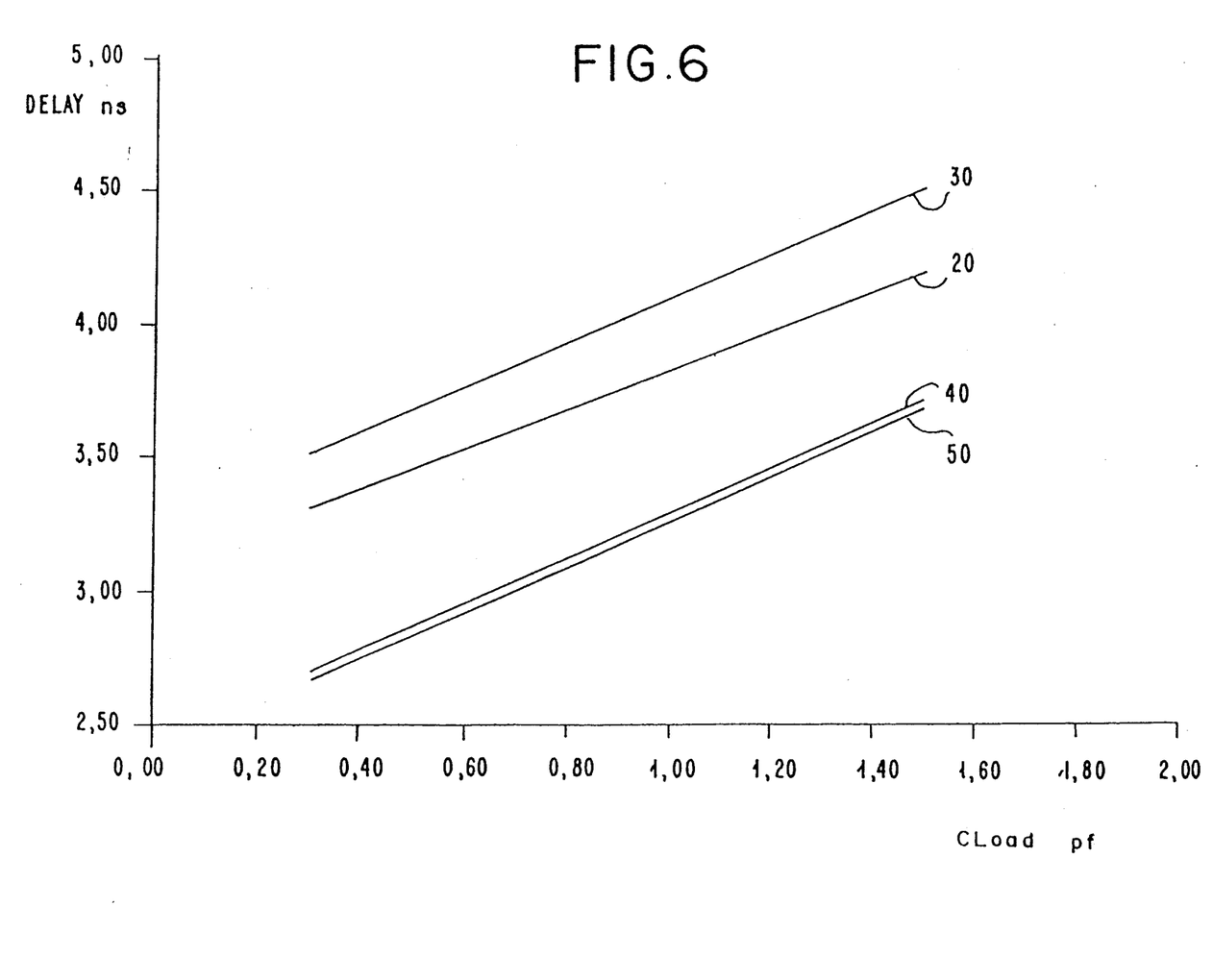
FIG. 6 is a graph showing latch performance versus load capacitance for the different embodiments discussed in this application.

Performance curves versus load capacitance are shown in FIG. 6 and represent the worst delay (Rise or Fall delay) for the master only.

Comparative results between the different embodiments are given in the following table (PHSRL 20 is given as the reference):

| PHSRL | 20 | 30 | 40 | 50 |
| --- | --- | --- | --- | --- |
| Wost Case Delay | 1 | 0.97 | 0.95 | 0.95 |
| Average Delay | 1 | 1 | 0.92 | 0.90 |
| Clock Minimum Pulse Width | 1 | 1.25 | 1.10 | 1 |
| Density | 1 | 0.85 | 0.85 | 0.85 |
| Power Dissipation | 1 | 0.55 | 0.55 | 0.55 |

PHSRL 50 presents a good synthesis of all advantages:

better performances: 5 to 10%
better density: 15%
smaller power dissipation: divided by 1.8.

We claim:

1. A basic latch cell with a single ended data input in a CMOS gate array, comprising:
   a data input node receiving data signals;
   a clock input node receiving a clock signal;
   a data output node;
   first and second voltage supplies;
   a pair of cross coupled first and second inverters forming respective first and second stages, each stage being provided with first and second voltage supply nodes connected to said first and second voltage supplies, respectively;
   a data storage node which is a common node between the output of the first inverter and the input of the second inverter;
   a transmission gate arranged to selectively connect said data storage node to said data input node and controlled by said clock input node, characterized in that the gate includes variable load means connected in a negative feedback loop to form a pull down leg between the data storage node and the data input node of the latch cell, to increase the output impedance of said second stage;
   further characterized in that said variable load means are comprised of one device controlled by the clock signal, mounted in series with another device, the gate of said other device being connected to the data input node.

* * * * *